(12) United States Patent
Straβburg et al.

(10) Patent No.: US 9,966,503 B2
(45) Date of Patent: May 8, 2018

(54) OPTOELECTRONIC SEMICONDUCTOR COMPONENT AND METHOD FOR PRODUCING AN OPTOELECTRONIC SEMICONDUCTOR COMPONENT

(71) Applicant: OSRAM Opto Semiconductors GmbH, Regensburg (DE)

(72) Inventors: Martin Straβburg, Donaustauf (DE); Martin Mandl, Lappersdorf (DE); Tilman Schimpke, Regensburg (DE); Ion Stoll, Tegernheim (DE); Barbara Huckenbeck, Augsburg (DE); Franz Zwaschka, Ismaning (DE); Daniel Bichler, München (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days. days.

(21) Appl. No.: 15/038,562

(22) PCT Filed: Dec. 18, 2014

(86) PCT No.: PCT/EP2014/078404
§ 371 (c)(1),
(2) Date: May 23, 2016

(87) PCT Pub. No.: WO2015/091754
PCT Pub. Date: Jun. 25, 2015

(65) Prior Publication Data
US 2016/0300983 A1    Oct. 13, 2016

(30) Foreign Application Priority Data
Dec. 19, 2013  (DE) .................. 10 2013 114 466

(51) Int. Cl.
*H01L 33/50* (2010.01)
*H01L 33/08* (2010.01)
(Continued)

(52) U.S. Cl.
CPC ............ *H01L 33/502* (2013.01); *H01L 33/08* (2013.01); *H01L 33/32* (2013.01); *H01L 33/505* (2013.01);
(Continued)

(58) Field of Classification Search
None
See application file for complete search history.

(56) References Cited

U.S. PATENT DOCUMENTS 7,982,233 B2 *  7/2011  Berben ................. H01L 33/508
                                                      257/98
8,742,433 B2 *  6/2014  Ajiki ................... H01L 25/0753
                                                      257/88

(Continued)

FOREIGN PATENT DOCUMENTS

DE    102010051286 A1    5/2012
DE    102011113962 A1    3/2013
(Continued)

Primary Examiner — Andres Munoz
(74) Attorney, Agent, or Firm — Slater Matsil, LLP (57) ABSTRACT

An optoelectronic semiconductor component and a method for manufacturing an optoelectronic semiconductor component are disclosed. In an embodiment, the component includes a plurality of active regions configured to generate a primary radiation and a plurality of luminescent material particles configured to convert the primary radiation into a secondary radiation, wherein the active regions are arranged spaced apart from each other, wherein each active region has a main extension direction, wherein each active region has a core region comprising a first semiconductor material, wherein each active region has an active layer covering the core region, wherein each active region has a cover layer (Continued)

comprising a second semiconductor material and covering the active layer, wherein at least some of the luminescent material particles are arranged between the active regions, and wherein a diameter of a majority of the luminescent material particles is smaller than a distance between two adjacent active regions.

16 Claims, 6 Drawing Sheets

(51) Int. Cl.
  *H01L 33/32* (2010.01)
  *H01L 33/56* (2010.01)
  *H01L 27/15* (2006.01)
  *H01L 33/24* (2010.01)
(52) U.S. Cl.
  CPC ............ *H01L 33/56* (2013.01); *H01L 27/156* (2013.01); *H01L 33/24* (2013.01); *H01L 33/504* (2013.01); *H01L 2933/005* (2013.01); *H01L 2933/0041* (2013.01); *H01L 2933/0091* (2013.01)

(56) References Cited

U.S. PATENT DOCUMENTS

| | | |
|---|---|---|
| 8,969,900 B2 | 3/2015 | Sabathil et al. |
| 2009/0242921 A1* | 10/2009 | Aliyev ............... C25D 7/00 257/98 |
| 2010/0038665 A1* | 2/2010 | Sugiura ............... H01L 33/508 257/98 |
| 2011/0220920 A1 | 9/2011 | Collins et al. |
| 2012/0205695 A1* | 8/2012 | Lin ................... H01L 33/44 257/98 |
| 2013/0026524 A1 | 1/2013 | Chiang et al. |
| 2013/0119415 A1* | 5/2013 | Wu .................... H01L 25/0753 257/89 |
| 2013/0119418 A1* | 5/2013 | Donofrio .......... B29D 11/00894 257/98 |
| 2013/0328066 A1 | 12/2013 | Sabathil et al. |
| 2014/0231855 A1 | 8/2014 | Stoll et al. |
| 2014/0285088 A1 | 9/2014 | Windisch |
| 2015/0021636 A1 | 1/2015 | Mandl et al. |
| 2015/0179897 A1* | 6/2015 | Andrews ............... H01L 33/60 257/88 |
| 2015/0349215 A1 | 12/2015 | Gootz et al. |

FOREIGN PATENT DOCUMENTS

| | | | |
|---|---|---|---|
| DE | 102011085645 A1 | 5/2013 | |
| DE | 102012101718 A1 | 9/2013 | |
| DE | 102013207579 A1 | 10/2013 | |
| DE | 102012104035 A1 | 11/2013 | |
| DE | 102012105691 A1 | 1/2014 | |
| WO | 2010014032 A1 | 2/2010 | |
| WO | WO 2012062635 A1 * | 5/2012 | ............ H01L 33/08 |
| WO | 2013029862 A1 | 3/2013 | |
| WO | 2013127672 A1 | 9/2013 | |

* cited by examiner

OPTOELECTRONIC SEMICONDUCTOR COMPONENT AND METHOD FOR PRODUCING AN OPTOELECTRONIC SEMICONDUCTOR COMPONENT

This patent application is a national phase filing under section 371 of PCT/EP2014/078404, filed Dec. 18, 2014, which claims the priority of German patent application 10 2013 114 466.7, filed Dec. 19, 2013, each of which is incorporated herein by reference in its entirety.

TECHNICAL FIELD

The invention is directed to an optoelectronic semiconductor component and a method for producing an optoelectronic semiconductor component.

BACKGROUND

The work leading to this invention has received funding from the European Union Seventh Framework Programme $FP_7$-NMP-2011-SMALL-5 under grant agreement n° 280694.

International Application WO 2013/029862 A1 describes an optoelectronic semiconductor component and a method for producing an optoelectronic semiconductor component.

SUMMARY OF THE INVENTION

Embodiments of an optoelectronic semiconductor component and embodiments for manufacturing an optoelectronic semiconductor component are provided.

According to at least one embodiment of the optoelectronic semiconductor component, the optoelectronic semiconductor component comprises a multiplicity of active regions. The active regions are each configured for generating a primary radiation. For example, during operation, the active regions generate light in the spectral range between UV radiation and infrared radiation, in particular visible light. The optoelectronic semiconductor component can comprise two or more active regions, in particular a hundred or more active regions or a thousand or more active regions. The active regions are, for example, connected to each other in an electrically conductive manner such that at least 50% of the active regions, in particular at least 75%, for example all of the active regions, generate the primary radiation at the same time during operation.

According to at least one embodiment of the optoelectronic semiconductor component, the optoelectronic semiconductor component comprises a multiplicity of luminescent material particles which are configured for converting the primary radiation into secondary radiation. The luminescent material particles can be configured, for example, for converting a higher-energy primary radiation into a lower-energy secondary radiation. However, it is also possible for the luminescent material particles to be configured for converting a low-energy primary radiation into a higher-energy secondary radiation. In this case, for example, infrared primary radiation can be converted into visible light. Thereby, it is possible for the luminescent material particles to convert a majority of the primary radiation, or within manufacturing tolerances all of the primary radiation, into secondary radiation. It is further possible that only some of the primary radiation is converted into secondary radiation by the luminescent material particles, and therefore the optoelectronic semiconductor component emits mixed light during operation, said mixed light being composed of the primary radiation and the secondary radiation. The optoelectronic semiconductor component can then emit in particular white mixed light during operation.

According to at least one embodiment of the optoelectronic semiconductor component, at least a plurality of the active regions is arranged spaced apart from each other. That is to say, the active regions do not contact each other at least in regions but rather are formed as mutually separate regions at least in regions. The active regions can be arranged spaced apart from each other at least in regions for example in lateral directions which extend in parallel with a main extension plane of the optoelectronic semiconductor component. The active regions can thereby be connected together e.g. at their base surfaces or their cover surfaces by a common material or a common carrier. However, in particular, the regions of the active regions which emit primary radiation during operation of the optoelectronic semiconductor component are arranged spaced apart from each other.

The active regions can each have a main extension direction. The main extension directions of a majority, e.g. of all active regions, can extend in parallel with each other within manufacturing tolerances. The main extension direction then extends e.g. transversely or perpendicularly to the lateral directions, in which the active regions are arranged spaced apart from each other. The active regions can have a core region which is connected to a first semiconductor material. The active regions can be connected to each other in each case at a base surface and/or a cover surface of the active regions via this first semiconductor material.

Furthermore, the active regions have an active layer which covers the core region at least in directions transverse to the main extension direction of the active region. That is to say, the active layer can be formed on peripheral surfaces and, if applicable, also on cover surfaces of the active regions and can cover the core region at that location. In particular, it is also possible, however, that base surfaces and/or cover surfaces of the active regions are each free of the active layer and merely peripheral surfaces of the active regions are covered by the active layer.

Furthermore, the active regions can comprise a cover layer which is formed with a second semiconductor material and covers the active layer at least in directions transverse to the main extension direction of the active region. The cover layer can be formed, for example, with a second semiconductor material which differs from the first semiconductor material in particular in its doping.

On the whole, it is thus possible that a majority, in particular all, of the active regions each have a core region which is covered in each case by an active layer in directions transverse to the main extension direction of the active region, which active layer is in turn covered by a cover layer in each case in particular also in directions transverse to the main extension direction of the active region.

The active regions can thereby be in particular so-called nanorods or microrods, in which a shell having an active layer is applied around a core which extends in all three spatial directions. In particular, these are core shell nanorods or core shell microrods. The semiconductor material, with which the active regions are formed, is for example a nitride compound semiconductor material. In particular, the active regions can be based on InGaN.

The active regions have a diameter, as measured in lateral directions, of e.g. between at least 100 nm and at the most 5 μm. In the main extension direction, the active regions have a length which is larger than the diameter. For example, the length of the active regions is at least twice as large as the diameter, in particular at least five times as large as the diameter, in particular at least 20 times as large as the diameter of the active regions.

According to at least one embodiment of the optoelectronic semiconductor component, at least some of the luminescent material particles are arranged between the active regions. That is to say, at least some of the multiplicity of luminescent material particles is arranged in the space between the active regions which are spaced apart from each other. In particular, it is possible that the space between the active regions is filled at least partially by luminescent material particles. The luminescent material particles thereby have in particular for the most part a diameter which is smaller than the distance between two adjacent active regions of the multiplicity of active regions. That is to say, at least a majority of the luminescent material particles, e.g. at least 75%, in particular at least 90%, within manufacturing tolerances in particular all of the luminescent material particles, have a diameter which is smaller than the distance between two adjacent active regions of the multiplicity of active regions. Thereby, the active regions are preferably arranged uniformly, e.g. at the lattice points of a regular lattice, and therefore the distance between adjacent active regions deviates a little or hardly by an average value.

According to at least one embodiment, an optoelectronic semiconductor component is provided having: a multiplicity of active regions which are configured for generating primary radiation, and a multiplicity of luminescent material particles which are configured for converting the primary radiation into secondary radiation, wherein at least a plurality of the active regions are arranged spaced apart from each other, have a main extension direction, have a core region which is formed with a first semiconductor material, have an active layer which covers the core region at least in directions transverse to the main extension direction of the active region, and have a cover layer which is formed with a second semiconductor material and covers the active layer at least in directions transverse to the main extension direction of the active region, at least some of the luminescent material particles are arranged between the active regions, and the diameter of a majority of the luminescent material particles is smaller than the distance between two adjacent active regions of the multiplicity of active regions.

An optoelectronic semiconductor component described herein having a multiplicity of active regions is characterized in particular in that owing to the multiplicity of active regions which extend along a main extension direction, the radiation-emitting surface of the optoelectronic semiconductor component is enlarged. The active regions can be produced with a III-V material, in particular a III-N material and, depending upon the indium content in the active layer, emit e.g. light with a peak wavelength in a wavelength range of at least 380 nm to at the most 550 nm. Thereby, the peak wavelength is in particular the wavelength of maximum emission. In particular, blue light is generated. In order to generate white light, a luminescence conversion material is arranged downstream of the active regions in the beam path of the primary radiation.

The consideration behind an optoelectronic semiconductor component described herein is inter alia that a luminescent material arranged as close as possible to an active region is advantageous since the tight connection of the luminescent material to the active regions permits improved heat dissipation of the Stokes losses produced during the conversion. In addition, the active regions are mechanically stabilized by introducing luminescent material particles between the active regions. Furthermore, it has been shown that luminescent material particles can also scatter the primary radiation which results in the fact that primary radiation exiting at the cover layer of the active regions can be scattered in the direction of the main extension direction and in this manner the emission efficiency of the optoelectronic semiconductor component is increased since the absorption of primary radiation of one active region into adjacent active regions is reduced in this manner. Furthermore, the luminescent material particles convert at least some of the primary radiation into secondary radiation which, owing to the e.g. relatively large band gap in the active layer of the active regions, can hardly be absorbed thereby.

In the present case, in order to form the optoelectronic semiconductor component, luminescent material particles are selected which are characterized by a small diameter, and therefore the luminescent material particles can be arranged between adjacent active regions, that is to say the luminescent material particles fit, in terms of their size, between adjacently arranged active regions.

According to at least one embodiment, the distance between the active regions is selected to be so large that no nanoparticles have to be used for the luminescent materials. That is to say, the luminescent materials then have a diameter, e.g. a D90 diameter, of at least 100 nm.

According to at least one embodiment of the optoelectronic semiconductor component, the D90 diameter of the luminescent material particles is smaller than the average minimum distance between adjacent active regions of the multiplicity of active regions. "D90 diameter" means that 90% of the luminescent material particles are smaller than the stated value. The diameter is determined e.g. in $Q_3$. $Q_3$ in this case stands for the mass distribution sum or the volume distribution sum. For luminescent material particles whose D90 diameter is smaller than the average minimum distance between adjacent active regions, it is ensured that substantially all of the luminescent material particles have a size such that the luminescent material particles fit between adjacent active regions. That is to say, with such luminescent material particles, within manufacturing tolerances, the maximum diameter of all the particles is smaller than the distance between two active regions of the optoelectronic semiconductor component.

Here and hereinafter, the term 'diameter' is to be understood to mean in particular the equivalent diameter which is more particularly the volumetric equivalent diameter.

In contrast thereto, luminescent material particles which are used e.g. in light-emitting diodes were previously produced as luminescent material particles which were as large as possible because in conventional light-emitting diodes these are more efficient than fine luminescent material particles. In these conventional luminescent material particles, the average particle size, the D50 diameter, is typically D50>5 µm.

According to at least one embodiment of the optoelectronic semiconductor component, the D50 diameter of the luminescent material particles is between at least 10% and at the most 50% of the average minimum distance between adjacent active regions of the multiplicity of active regions. The D50 diameter specifies the average particle size, wherein 50% of the luminescent material particles have a diameter which is smaller than the stated range.

In the present case, the average minimum distance between adjacent active regions is preferably between at least 1.5 µm and at the most 10 µm. The D50 diameter of the luminescent material particles is thus between at least 200 nm and at the most 5 µm. In particular, a D50 diameter of the luminescent material particles between at least 0.5 µm and at the most 2.5 µm is preferred. The average minimum distance between the active regions is, within manufacturing tolerances, 5 µm for example.

The luminescent material particles are selected, for example, from the following group of luminescent materials: garnets of general composition (Y,Lu,Gd,Ce)3(Al,Ga)5O12, (Y,Lu,Gd,Ce,Tb)3(Al,Ga)5O12, (EA,SE)2Si(O,N)4, where EA designates one or more elements of the alkaline earth metals, EAAl-SiN3EU, where EA designates one or more elements of the alkaline earth metals, luminescent material particles consisting of inorganic semiconductor material, for example consisting of II-VI-semiconductor materials such as CdSe, CdZn, CdS, ZnO.

In particular, the luminescent material particles thereby have a particularly homogeneous morphology. For instance, the luminescent material particles consist, within manufacturing tolerances, predominantly or completely of individual crystallites or small agglomerates of individual crystallites and hardly contain splintered or broken grains.

According to at least one embodiment of the optoelectronic semiconductor component, the optoelectronic semiconductor component includes a current spreading layer which covers the multiplicity of active regions at their outer surfaces at least in places and connects same together in an electrically conductive manner. For example, the current spreading layer is in direct contact with the cover layer of the active regions. The current spreading layer can completely cover the active regions at their exposed outer surface. The current spreading layer is then preferably formed to be radiolucent.

In such a case, the current spreading layer can be formed with a semiconductor material or with a transparent conductive oxide. In that case, ITO is suitable as the material for forming the current spreading layer for example. It is further possible for the current spreading layer to be formed with a radiopaque, e.g. reflective, material such as, for example, a metal. In that case, the current spreading layer does not completely cover the active regions but rather is in direct contact therewith e.g. only in a limited region of the outer surface of the active regions. It is further possible for the current spreading layer to be formed with a semitransparent, conductive material which is then thinly applied. In this case, the current spreading layer can be formed e.g. with graphene or can consist of graphene.

According to at least one embodiment of the optoelectronic semiconductor component, some of the luminescent material particles directly adjoin the cover layer of one of the multiplicity of active regions and/or some of the luminescent material particles directly adjoin the current spreading layer. If, for example, a current spreading layer is provided which completely or partially covers the active regions, then some of the luminescent material particles can then be in direct contact with this current spreading layer. In the scenario when a current spreading layer is not provided, some of the luminescent material particles directly adjoin the cover layer of an active region.

In both cases, in particular a matrix material arranged between the active region and the adjoining luminescent material particles is not provided. That is to say, the luminescent material particles can be brought particularly close to the outer surface of an active region. In this manner, for example, heat can be efficiently dissipated from the luminescent material particles via the active regions. The distance between the luminescent material particles and the active layer is preferably at the most 100 nm, in particular between at least 0.1 and at the most 100 nm. For example, the distance is between at least 0.1 nm and at the most 10 nm, in particular between at least 0.1 nm and at the most 4 nm.

According to at least one embodiment of the optoelectronic semiconductor component, the optoelectronic semiconductor component includes different types of luminescent material particles. The different types of luminescent material particles can be e.g. luminescent material particles of different sizes. It is further possible that different types of luminescent material particles differ from each other in terms of their chemical composition.

Different types of luminescent material particles can be arranged in different layers. It is, for example, possible that so many luminescent material particles are arranged in a first layer that the outer surface of the active regions is covered thereby, but the intermediate spaces between the active regions still has an empty volume. In that case, a different type of luminescent material particle can then fill these intermediate spaces. It is further possible that the first type of luminescent material particle completely occupies the active regions and the intermediate spaces between the active regions and the second type of luminescent material particle is applied onto the first type of luminescent material particle as a layer.

For example, it is possible to apply a red light-emitting luminescent material in the form of a first type of luminescent material particle particularly close to the active regions. In that case, a second type of luminescent material particle which emits green and/or yellow secondary radiation is applied onto the first type of luminescent material particle. In this manner it is ensured that secondary radiation emitted by the first type of luminescent material particle is absorbed into the second type of luminescent material particle to the least possible extent.

According to at least one embodiment of the optoelectronic semiconductor component, the luminescent material particles are at least partially covered by radiation-scattering particles, that is to say radiation-scattering particles can also be applied in addition to the luminescent material particles. The radiation-scattering particles are not provided for conversion purposes. The radiation-scattering particles can be formed e.g. with a metal oxide, a metal nitride, a semiconductor oxide or a semiconductor nitride. For example, particles consisting of at least one of the following materials are suitable for forming the radiation-scattering particles: TiO2, Al2O3, ZrO2, SiO2.

The D50 diameter of the radiation-scattering particles is preferably in the range between 50 nm and 500 nm. That is to say, the radiation-scattering particles have, on average, a smaller diameter than the luminescent material particles. In this manner, it is possible that radiation-scattering particles can also be introduced between already applied luminescent material particles. The radiation-scattering particles can form e.g. a layer which appears white.

According to at least one embodiment of the optoelectronic semiconductor component, the luminescent material particles are at least partially covered by radiation-absorbing particles. The radiation-absorbing particles which are likewise not provided for conversion purposes can be e.g. carbon or an inorganic pigment. The radiation-absorbing particles which e.g. can have a D50 diameter in the range of at least 50 nm to at the most 500 nm is used to increase the contrast between the light which is emitted at different active regions which becomes particularly noticeable when light emitted from the optoelectronic semiconductor component is projected onto a remote surface. Particular wavelength ranges of the emitted light can be absorbed after conversion by absorbers, e.g. inorganic pigments, whereby undesired wavelengths in the light can be removed. In this manner, it is possible to generate e.g. light having particular color purity.

According to at least one embodiment of the optoelectronic semiconductor component, the luminescent material particles and, if applicable, the further particles are applied electrophoretically. That is to say, the particles are deposited onto the active regions and between the active regions using an electrophoresis method. The fact that the particles are applied electrophoretically can be seen e.g. with the aid of residues of the suspension, from which the particles are deposited, and the high density at which the particles are arranged on and between the active regions. The feature "deposited electrophoretically" is thus not a method feature but an object feature which can further be seen on the finished product, i.e. on the optoelectronic semiconductor component.

According to at least one embodiment of the optoelectronic semiconductor component, a passivation layer covers the luminescent material particles and, if applicable, the radiation-scattering particles and/or the radiation-absorbing particles at least on their sides facing away from the active regions.

The passivation material is in particular an electrically insulating material. Furthermore, the passivation material can be suitable to protect the particles and the active regions from moisture and atmospheric gases. The passivation material can have a higher refractive index than air, wherein the refractive index is e.g. between that of air and that of the semiconductor material of the optoelectronic semiconductor component, i.e. for example the refractive index of GaN. In a particularly preferred manner, the refractive index of the passivation material is greater than or equal to 1.4 and the passivation material permits in this manner an improved out-coupling of the light from the semiconductor body of the optoelectronic semiconductor component.

The passivation material which forms the passivation layer can be e.g. synthetic material such as silicones, silicone hybrids and epoxy resins. Such materials can be applied on and between the active regions by spin-coating, dispensing or an injection molding or transfer molding process. In addition or alternatively, the passivation material can be parylene which is applied for example by vapor deposition as a passivation layer with a thickness of at least 500 nm to at the most 20 µm. Such a material is able to diffuse into the smallest possible gaps and can also penetrate between the luminescent material particles and, if applicable, the further particles.

Furthermore, the passivation layer can be formed by a glass layer which can be produced e.g. by casting.

It is further possible that the passivation layer includes inorganic materials such as aluminum oxide, silicon oxide, silicon nitride, titanium dioxide or tantalum oxide which are applied by vapor deposition processes such as CVD, PVD or ALD onto the active regions, the particles and between the active regions. These materials are also able to diffuse into the smallest possible gaps and in this manner can be arranged between the luminescent material particles in the optoelectronic semiconductor component.

According to at least one embodiment of the optoelectronic semiconductor component, the optoelectronic semiconductor component is free of a matrix material. That is to say, the luminescent material particles and the other particles described herein are not applied onto the active regions and between the active regions whilst dissolved in a matrix material, wherein the matrix material remains in the component, but rather the particles are deposited without the use of a matrix material remaining in the semiconductor component and, if applicable, are covered by the material of the passivation layer at a subsequent point in time. In this manner it is possible to bring the luminescent material particles as close as possible to the active regions in layers which are defined as precisely as possible. Furthermore, the electrophoretic deposition of the luminescent material particles is a particularly protective application method, by means of which damage to the active regions, which are capable of being easily mechanically damaged, cannot occur. In particular, if luminescent material particles are applied onto or between the active regions within a matrix material, the used methods such as injection molding or transfer molding can cause damage to the active regions, e.g. severing of individual active regions, which is avoided in the present case.

A method for producing an optoelectronic semiconductor component is also provided. An optoelectronic semiconductor component described herein can be produced by means of a method described herein. That is to say that all of the features disclosed for the optoelectronic semiconductor component are also disclosed for the method, and vice versa.

According to at least one embodiment of the method for producing an optoelectronic semiconductor component, a suspension is provided which includes a solvent and a multiplicity of luminescent material particles. The luminescent material particles are configured for converting primary radiation into secondary radiation.

The solvent includes for example water, alcohol, ketone, aromatic hydrocarbon, aliphatic hydrocarbon. At least one type of luminescent material particle is introduced into the solvent. Prior to introducing the luminescent materials into the solvent, the particle surface of the luminescent material particles can be wetted or moistened with water.

Furthermore, a multiplicity of active regions which is configured for generating primary radiation are provided. The multiplicity of active regions can be, for example, as stated further above, core shell nanorods or core shell microrods.

According to at least one embodiment of the method, an electrophoretic deposition of at least some of the luminescent material particles of the suspension between the active regions takes place, wherein the diameter of a majority of the luminescent material particles which are deposited is smaller than the distance between two adjacent active regions of the multiplicity of active regions. For this purpose, the multiplicity of active regions can be introduced e.g. together with the suspension into a reaction vessel. In an electrical voltage field, the luminescent material particles are then electrophoretically deposited between the active regions and on the active regions, wherein at least some of the active regions form an electrode for the electrophoretic deposition.

According to at least one embodiment of the method, the method comprises the following steps: providing a multiplicity of active regions which are configured for generating primary radiation, providing a suspension comprising a solvent and a multiplicity of luminescent material particles which are configured for converting the primary radiation into secondary radiation, electrophoretically depositing at least some of the luminescent material particles between the active regions, wherein the diameter of a majority of the luminescent material particles, which are electrophoretically deposited, is smaller than the distance between two adjacent active regions of the multiplicity of active regions.

By way of the electrophoretic deposition, the luminescent material particles are preferably deposited on the protruding active regions, which form three-dimensional structures, in particular on the lateral surfaces of the active regions owing to a field line curve in the electrical voltage field. As a result, the active regions can be covered particularly effectively with luminescent material particles, whereby the coupling of the luminescent material particles to the active regions is improved and the reabsorption of primary radiation is reduced. For the electrophoretic deposition, luminescent material particles having an average particle size which corresponds e.g. to between at least 10% and at the most 50% of the distance between two adjacent active regions are used. The luminescent material particles are deposited on all of the electrically conductive regions, wherein an electrically conductive coating can also be provided which can be removed in a wet-chemical process following the electrophoretic deposition. Such a method is described in another context, e.g. in German patent application 102012105691.9, the disclosure content of which is hereby expressly incorporated by reference.

According to at least one embodiment of the method, a current spreading layer is used for contacting the multiplicity of active regions as an electrode during the electrophoretic deposition. That is to say, for example the current spreading layer, described further above, of the active regions, which layer can be formed e.g. with a transparent, conductive oxide, is used as a counter electrode for the electrophoretic deposition, and therefore the luminescent material particles are at least partially in direct contact with the current spreading layer after the electrophoretic deposition and in this manner are arranged particularly close to the active layer of the associated active region.

According to at least one embodiment of the method, the suspension is stored in a reaction vessel, in which the suspension can rest, for a predeterminable time period before the electrophoretic deposition. Thereby, luminescent material particles having a diameter greater than the minimum average distance between adjacent active regions settle at least for the most part, and are not also deposited during the subsequent electrophoretic deposition. The rest time can be at least one hour to e.g. at the most 24 hours. Owing to the settling process, the luminescent material particles having a large particle diameter collect at the bottom or in the lower region of the reaction vessel and are then not deposited on and between the active regions.

In addition to the solvent and the luminescent material particles, the suspension can contain the above-mentioned radiation-reflecting and/or radiating-absorbing particles or the active regions provided with luminescent material particles are arranged in a further suspension which contains said particles.

It is further possible that this suspension contains, in addition to the luminescent material particles and the solvent, inorganic salts such as e.g. nitrates, hydroxides, halides, sulfates, phosphates, oxides of alkaline earth metals and/or oxides of rare earth metals.

If different types of luminescent material particles are to be deposited in different layers, then different luminescent material particles can be deposited successively on and between the active regions. For this purpose, the active regions are initially introduced into a bath of a suspension having the first type of luminescent material particle and the first type of luminescent material particle is deposited. Following therefrom, the active regions are introduced into a second bath of a suspension having the second type of luminescent material particle and further luminescent material particles are deposited. The different types of luminescent material particles can differ from each other in terms of their chemical composition and/or the average particle size or the particle size distribution.

The conductive layer which is used as a counter electrode for the electrophoretic deposition, i.e. for example the current spreading layer, can be structured, and therefore a targeted action can be exerted on the deposition position of the luminescent material particles. For example, only a sub-region of the active regions can be provided with the conductive layer used as a counter electrode, whereby in that case only this region is covered with luminescent material particles.

In the case of the optoelectronic semiconductor components described herein and methods described herein, an electrophoretic deposition is combined with luminescent materials with a micrometer grain size which are applied onto active regions, more particularly onto so-called core shell microrods.

The active regions have a diameter, as measured in lateral directions, of e.g. between at least 100 nm and at the most 5 μm. In the main extension direction, the active regions have a length which is larger than the diameter. For example, the length of the active regions is at least twice as large as the diameter, in particular at least five times as large as the diameter, in particular at least 20 times as large as the diameter of the active regions. In this manner, the lateral surfaces of the active regions, on which electrophoretic deposition preferably occurs through the field line curve, form the largest surface of the active regions.

The optoelectronic semiconductor components described herein and the methods described herein are thus characterized by at least the following advantages: the size of the luminescent material particles specifically adapted to the active regions and the narrow size distribution of the luminescent material particles which can also be influenced by the settling in the suspension during the application process, allows the introduction of the luminescent material particles into the intermediate spaces between the active regions.

The electrophoretic deposition is particularly suitable for applying the luminescent material particles between the active regions. At the beginning of the deposition process, deposition takes place at the conductive surfaces of the active regions and thus preferably at the lateral surfaces of the active regions which form the largest surface of the active regions. As the deposition time period increases, the regions between the active regions can be filled, and even overfilled. As a result, a desired chromaticity coordinate of the generated light can be adjusted.

The extremely tight connection of the luminescent material particles to the active regions allows heat to be particularly efficiently dissipated from the luminescent material particles and thus allows the temperature-induced diminishment in the luminescent material efficiency to be reduced.

Furthermore, the luminescent material particles arranged between the active regions mechanically stabilize said regions.

The conversion of primary radiation generated in the active regions into in particular lower-energy secondary radiation reduces the reabsorption of primary radiation in adjacent active regions.

By using core shell microrods as active regions, the active volume and thus the luminous density of the optoelectronic semiconductor component is increased.

The electrophoretic deposition of the luminescent material particles allows a high degree of flexibility in relation to the filling extent, introduction of further functional materials such as scattering bodies and sequence of different materials than would be possible for example with settling only. By way of a corresponding structuring of the conductive layer which is used as a counter electrode, a targeted action can be exerted on the deposition position of the luminescent material particles and the further particles to be deposited.

BRIEF DESCRIPTION OF THE DRAWINGS

Optoelectronic semiconductor components described herein and methods described herein will be explained in more detail hereinafter with the aid of exemplified embodiments and the associated figures.

Identical, similar elements or elements which act in an identical manner are provided with the same reference numerals in the figures. The figures and the size ratios of the elements with respect to each other, as illustrated in the figures, are not to be considered as being to scale. Rather, individual elements can be illustrated excessively large for improved clarity and/or for improved understanding.

DETAILED DESCRIPTION OF ILLUSTRATIVE EMBODIMENTS

Figure 1A:
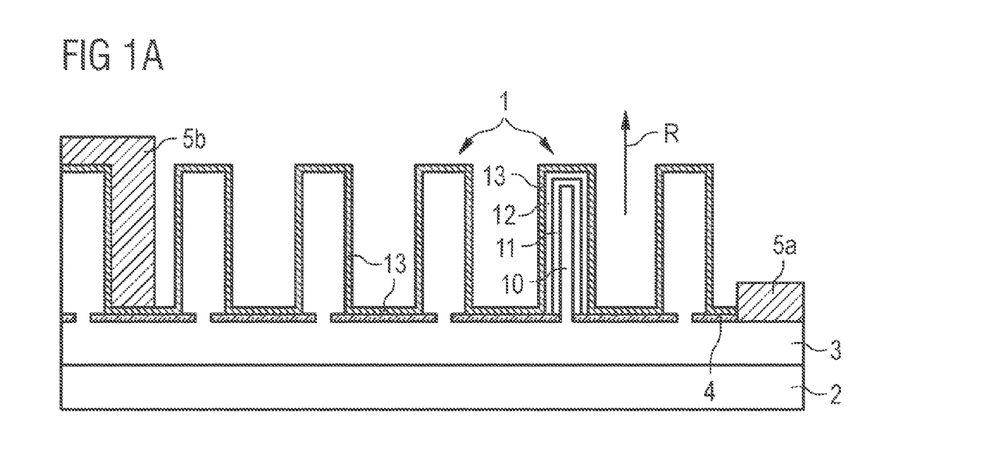
FIG. 1A shows a cross sectional view of a plurality of active regions and a current spreading layer according to embodiments.

A method step of an exemplified embodiment of a method described herein is explained in more detail in conjunction with the schematic sectional illustration in FIG. 1A.

In the method, initially a multiplicity of active regions 1 is provided. Each active region includes a core region 10 which is formed with a first semiconductor material which is, for example, an n-conductive GaN. The core region is completely covered by an active layer 11 which is provided for generating electromagnetic primary radiation and is based e.g. on InGaN. The active layer 11 is covered by a cover layer 12 which is formed, for example, with a second semiconductor material. The cover layer 12 can be formed, for example, with p-doped GaN.

The active region 1 has a main extension direction R, along which it extends. The active region 1 is preferably formed longer in the main extension direction R than it is wide in lateral directions, transverse or perpendicular to the main extension direction R. At their outer surfaces, the active regions 11 are each provided with a current spreading layer 13 which, in the exemplified embodiment in FIG. 1A, completely covers the active regions 1 at their exposed outer surface and, for example, can be formed with a transparent, conductive oxide.

The multiplicity of active regions 1 are connected together via the first semiconductor material 3 which can be epitaxially grown on a growth substrate 2. The first semiconductor material is, e.g. likewise n-doped GaN.

An insulation layer 4 is formed on the lower sides of the active regions 1 at the location where they are connected together via the first semiconductor material 3, which insulation layer can also be used as a mask for generating the active regions 1 during the epitaxial growth. However, the insulation layer 4 does not have to correspond to a growth mask and can also be introduced subsequently—that is to say upon completion of the epitaxial growth. The insulation layer 4 is formed, for example, with a semiconductor oxide or a semiconductor nitride such as silicon oxide or silicon nitride. The insulation layer 4 is formed in an electrically insulating manner and insulates the core region 10 and the first semiconductor material 3 from the cover layer 12 and the current spreading layer 13.

The current spreading layer 13 is connected to a connection point 5b in an electrically conductive manner, via which the optoelectronic semiconductor component can be contacted from the outside. Furthermore, the first semiconductor material 3 is connected to the connection point 5a in an electrically conductive manner, via which the semiconductor component can likewise be contacted.

Figure 1B:
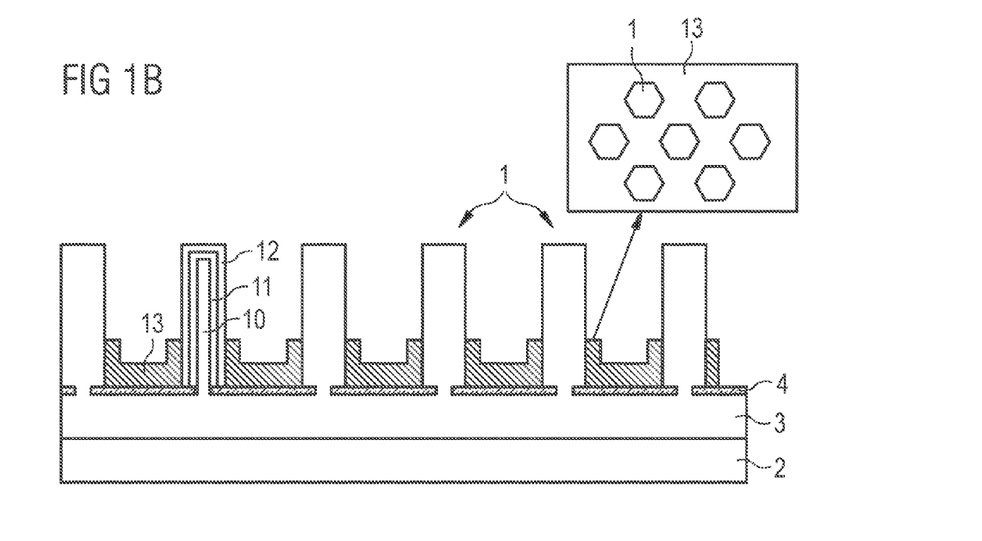
FIG. 1B shows a cross sectional view of a plurality of active regions and a current spreading layer according to other embodiments.

FIG. 1B illustrates an alternative design for the multiplicity of active regions, in which the current spreading layer 13 does not completely cover the active regions 1 but is merely formed at the base surface thereof. It can be seen from the schematic plan view in FIG. 1B that the current spreading layer 13 surrounds the active regions 1 in a frame-like manner and in particular completely covers the insulation layer 4 between active regions. In the subsequent electrophoretic deposition process, the current spreading layer 13 in FIG. 1A or the current spreading layer 13 in FIG. 1B can be used for depositing luminescent material particles 6. For the scenario with the active regions as per FIG. 1B, luminescent material particles can be deposited in a targeted manner in the lower region of the active regions 1, i.e. adjoining the first semiconductor material 3. For the scenario with the current spreading layer 13 as per FIG. 1A, the active regions can be completely covered with luminescent material particles.

Figure 1C:
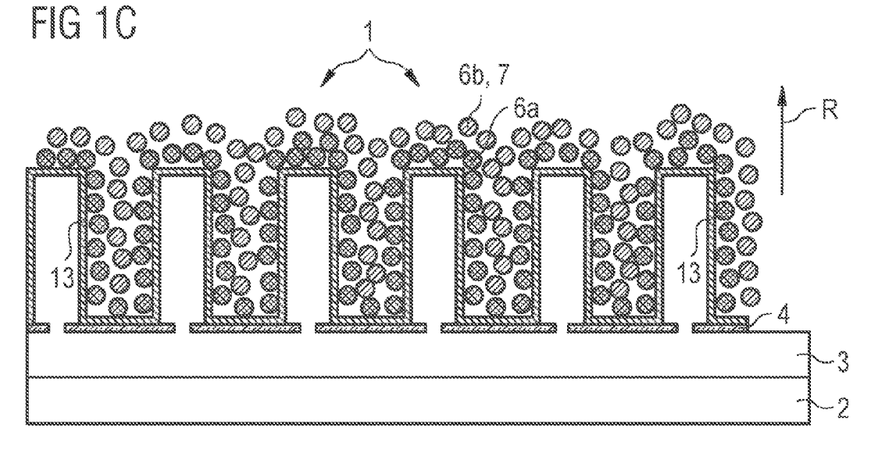
FIG. 1C shows a cross sectional view of deposited luminescent material particles according to embodiments.

FIG. 1C illustrates a method step in which luminescent material particles 6a are initially electrophoretically deposited on the current spreading layer 13, wherein the current spreading layer 13 is used as the counter electrode for the electrophoretic deposition. Then, a further type 6b of luminescent material particle and/or radiation-scattering particles or radiation-absorbing particles 7 can be deposited on the active regions and between the active regions 1.

Figure 1D:
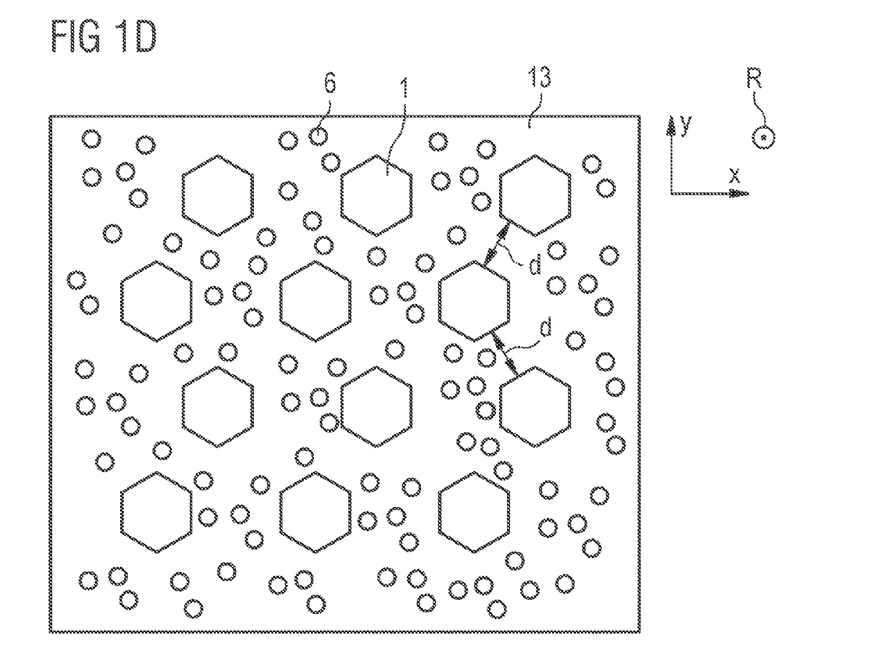
FIG. 1D shows a top view of deposited luminescent material particles according to embodiments.

The schematic plan view in FIG. 1D illustrates an application of luminescent material particles 6 merely in the region of the base surface of the active regions 1 between the active regions, as can be achieved for example by a current spreading layer 13 as a counter electrode for electrophoretic deposition, as illustrated in FIG. 1B.

In all of the exemplified embodiments, the average diameter of the luminescent material particles 6, 6a, 6b is selected such that the region between adjacent active regions is filled with a plurality of luminescent material particles which can be arranged next to each other. That is to say, the average diameter of the luminescent material particles is smaller than the average minimum distance d between adjacent active regions 1. In this manner, it is possible to bring a multiplicity of luminescent material particles as close as possible to the active layers 11 of the active regions.

Figure 2:
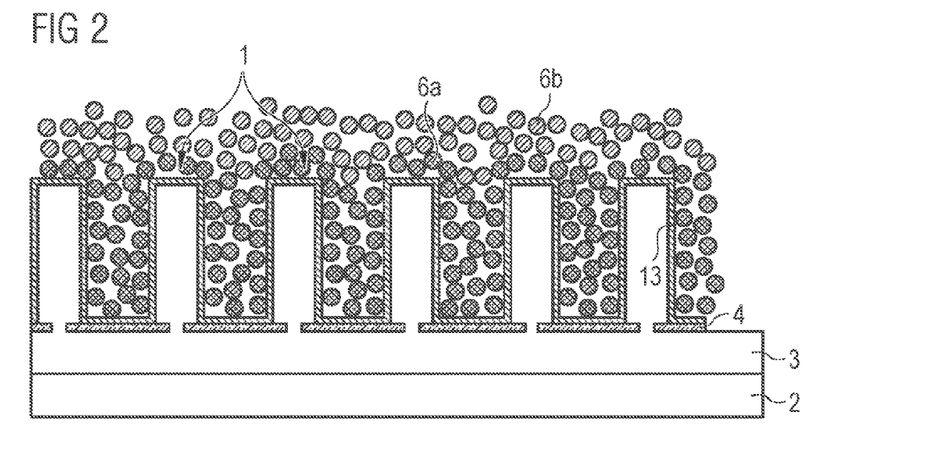
FIG. 2 shows a cross sectional view of deposited luminescent material particles according to further embodiments.

In the exemplified embodiment in FIG. 2, in contrast e.g. to the exemplified embodiment in FIG. 1C, an optoelectronic semiconductor component is illustrated in which the intermediate space between adjacent active regions 1 is completely filled with a first type 6a of luminescent material. The luminescent material 6a is thereby electrophoretically deposited. Then, a second type of luminescent material 6b, which differs from the first type of luminescent material e.g. in terms of its size, its size distribution or its chemical composition, is electrophoretically deposited on the first type of luminescent material, for example. However, it is also possible for the second type of luminescent material to be deposited using another method such as e.g. settling and to have a more conventional size distribution.

Figure 3:
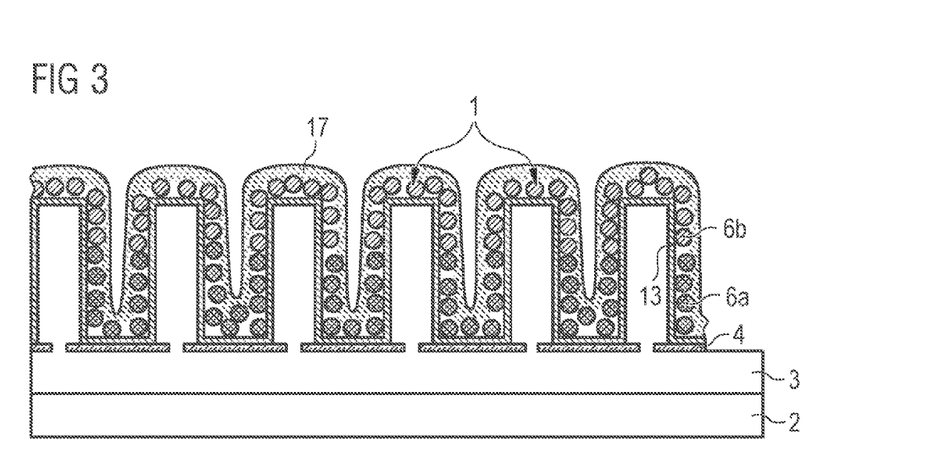
FIG. 3 shows a cross sectional view of different deposited luminescent material particles and a passivation layer according to embodiments.

An exemplified embodiment of an optoelectronic semiconductor component described herein is illustrated in conjunction with the schematic sectional illustration in FIG. 3, wherein a first portion of the multiplicity of active regions 1 is covered with luminescent material particles 6a of a first luminescent material and a second region is covered with a second type of luminescent material particle 6b. Such a distribution of different types of luminescent material can be used to particularly precisely adjust the color of the light radiated from the optoelectronic semiconductor component during operation. Optionally, as is also the case in the other illustrated exemplified embodiments, a passivation layer 17 can be applied at least on the outer surfaces of the luminescent material particles 6a, 6b, which layer is configured, for example, as described further above. The passivation layer 17 can fix the luminescent material particles and/or protect same from external mechanical and chemical influences.

Figure 4:
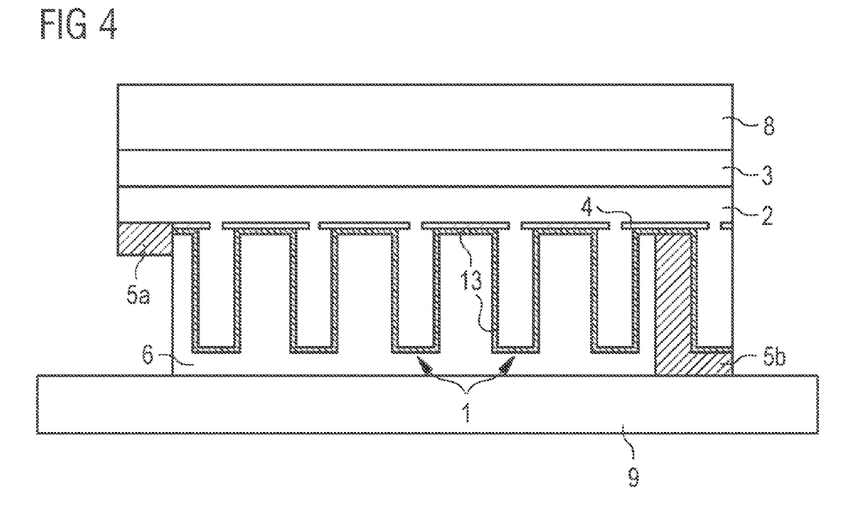
FIG. 4 shows a cross sectional view of an optoelectronic semiconductor component and a housing according to embodiments.

In the exemplified embodiment in FIG. 4, an optoelectronic semiconductor component described herein is applied onto a housing body 9 which can be formed e.g. to be reflective. The active regions 1 are surrounded by a first type of luminescent material particle 6 which, for reasons of clarity, is not illustrated in the form of beads in this figure and the following figures. A conversion element 8 is applied onto the base surface of the growth substrate 2 facing away from the first semiconductor material 3, which conversion element likewise can contain luminescent material particles or consists of luminescent material particles.

The luminescent material particles 6 which surround the active regions 1 can be luminescent material particles which convert to red light, for example. The conversion element 8 can be formed, e.g. with a yellow- and/or green-converting luminescent material. The growth substrate is formed for example with sapphire and is radiolucent. Mixed radiation consisting of the primary radiation, the secondary radiation generated by the luminescence conversion particles 6 and the further secondary radiation of the conversion element 8 can exit at the outer surface of the luminescence conversion element 8 facing away from the growth substrate. For example, the mixed radiation can be warm-white light.

Figure 5:
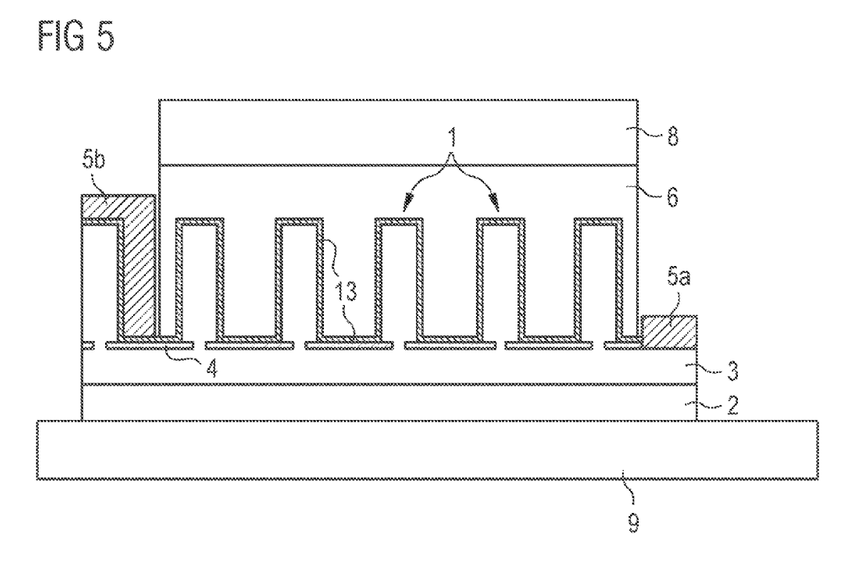
FIG. 5 shows a cross sectional view of an optoelectronic semiconductor component and a housing according to further embodiments.

In the exemplified embodiment in FIG. 5, in contrast to the exemplified embodiment in FIG. 4, the further conversion element 8 is arranged on the upper side of the luminescent material particles 6 facing away from the growth substrate 2.

Figure 6:
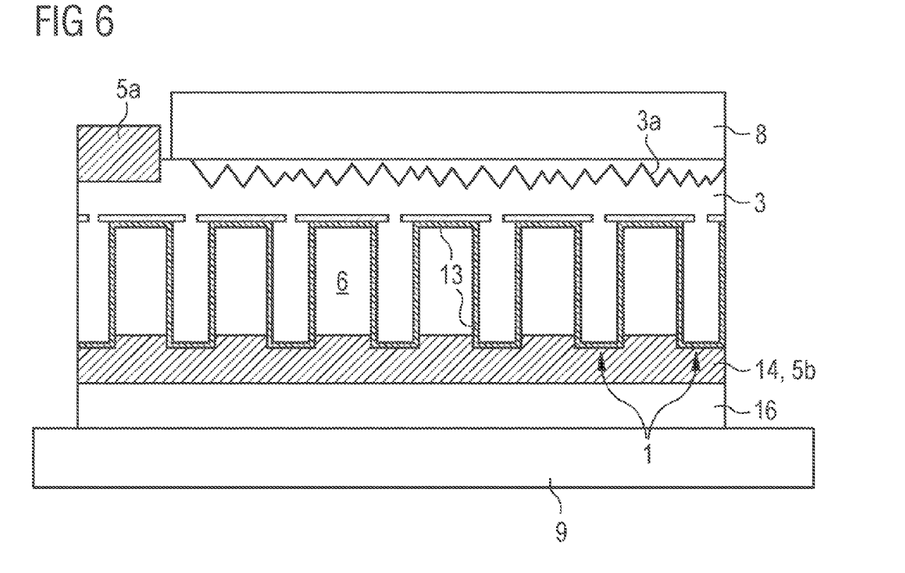
FIG. 6 shows a cross sectional view of an optoelectronic semiconductor component and a housing according to yet further embodiments.

In the exemplified embodiment in FIG. 6, a carrier 16, which can be electrically conductive, for example, is arranged between the housing 9 and the active regions 1. Following the carrier 16 is a reflective layer 14 which is also used as a connection point 5b for contacting the active regions 1, e.g. on the p-side. Primary radiation and secondary radiation generated by the luminescent material particles 6 and the active regions 1 pass through the first semiconductor material 3 which can be structured on its upper surface facing away from the reflector 14 in order to improve the radiation exit.

Optionally, a conversion element 8 which can be formed in FIGS. 4 and 5 is arranged on the upper side.

Figure 7:
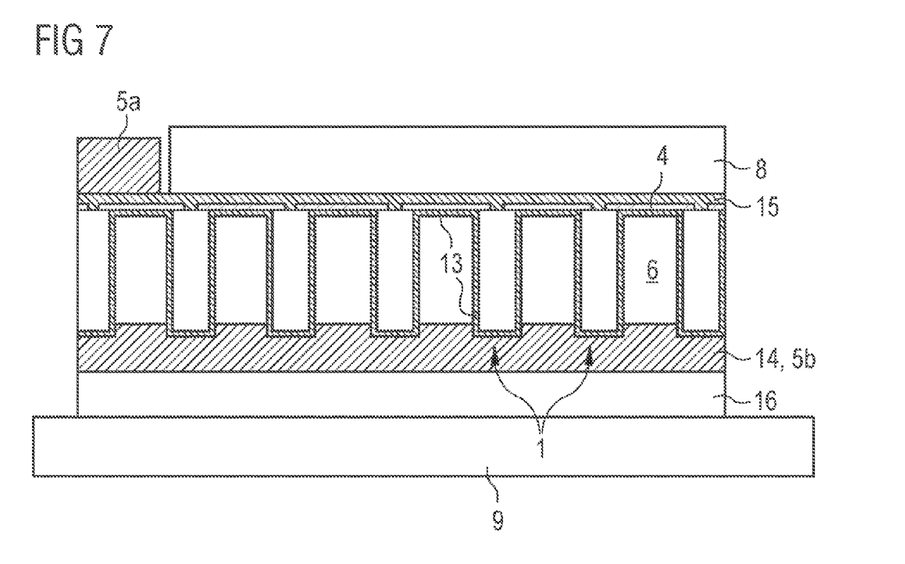
FIG. 7 shows a cross sectional view of an optoelectronic semiconductor component and a housing according to other embodiments.

In the exemplified embodiment in FIG. 7, in contrast to the exemplified embodiment in FIG. 6, the first semiconductor material 3 is removed such that the active regions 1 are no longer connected together by the first semiconductor material 3. An n-side connection of the active regions 1 is then effected via the electrically conductive adhesive layer 15 which is formed to be radiolucent. A conversion element 8 formed as described further above can be connected to the multiplicity of active regions 1 via the electrically conductive adhesive layer 15.

Figure 8A:
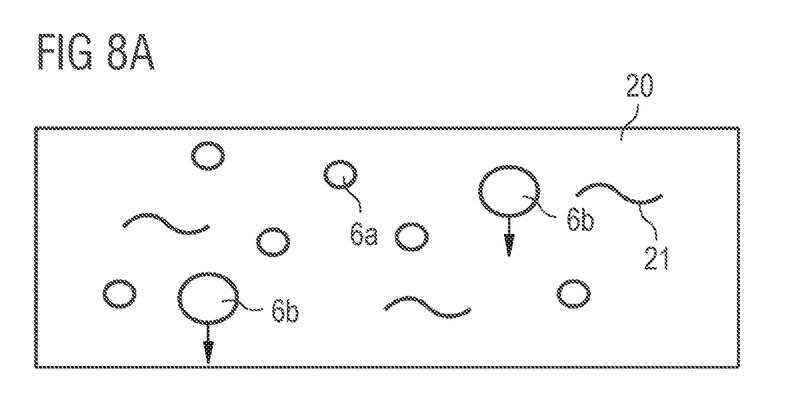
FIGS. 8A and 8B shows a suspension according to embodiments.
Figure 8B:
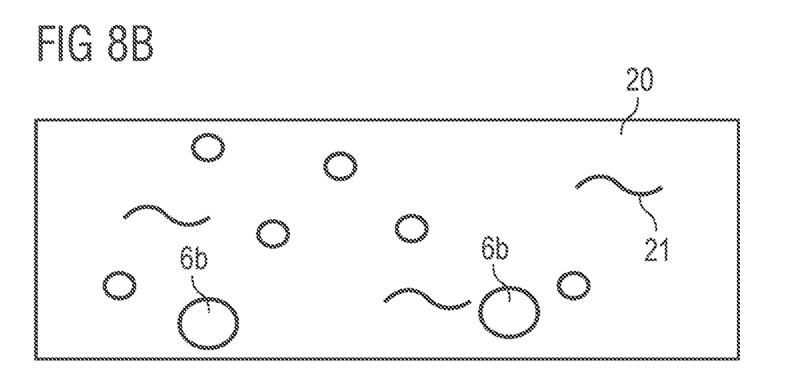

Method steps of a production method described herein are described in more detail in conjunction with FIGS. 8A and 8B. As illustrated in conjunction with FIG. 8A, initially a suspension 20 of a solvent 21 and differently sized luminescent material particles 6a, 6b is formed. This suspension 20 rests for a particular period of time, e.g. for at least one hour, whereby luminescent material particles 6b having a particularly large diameter, sink towards the bottom of the reaction vessel in which the suspension 20 is arranged. These larger luminescent material particles 6b are not available for subsequent electrophoretic deposition. That is to say, by selecting a predeterminable resting time for the suspension, the size distribution of the luminescent material particles, which are deposited on and between active regions 1, can be influenced and adjusted in a targeted manner.

The description made with reference to the exemplified embodiments does not restrict the invention to these embodiments. Rather, the invention encompasses any new feature and any combination of features, including in particular any combination of features in the claims, even if this feature or this combination is not itself explicitly indicated in the claims or exemplified embodiments.

The invention claimed is:
1. A method for producing an optoelectronic semiconductor component, the method comprising:
providing a plurality of active regions configured to generate a primary radiation;
providing a suspension comprising a solvent and luminescent material particles of different types, the luminescent material particles being configured to convert the primary radiation into a secondary radiation, wherein luminescent material particles of a first type are disposed in a first layer that covers an outer surface of each active region of the plurality of active regions, and wherein the first layer has intermediate spaces between two adjacent active regions of the plurality of active regions, and wherein luminescent material particles of a second type different from the first type fill the intermediate spaces; and electrophoretically depositing at least some of the luminescent material particles between active regions of the plurality of active regions, wherein a diameter of each luminescent material particle of a majority of the luminescent material particles, which are electrophoretically deposited, is smaller than a distance between two adjacent active regions of the plurality of active regions, and wherein different types of luminescent material particles are arranged in different layers.

2. The method according to claim 1, further comprising providing a current spreading layer on, and contacting, the plurality of active regions, and using the current spreading layer as an electrode during the electrophoretically depositing.

3. The method according to claim 1, wherein the suspension rests, before electrophoretically depositing, for a period of time in a reaction vessel such that luminescent material particles having a diameter which is greater than a minimum average distance between adjacent active regions of the plurality of active regions settle and subsequently are not electrophoretically deposited.

4. An optoelectronic semiconductor component, the component comprising:
a plurality of active regions configured to generate a primary radiation; and
luminescent material particles of different types configured to convert the primary radiation into a secondary radiation of different wavelengths,
wherein each active region of the plurality of active regions are arranged spaced apart from each other active region of the plurality of active regions,
wherein each active region of the plurality of active regions has a main extension direction,
wherein each active region of the plurality of active regions has a core region comprising a first semiconductor material,
wherein each active region of the plurality of active regions comprises an active layer covering the core region at least in directions transverse to the main extension direction of the respective active region,
wherein each active region of the plurality of active regions comprises a cover layer comprising a second semiconductor material and covering the active layer at least in the directions transverse to the main extension direction of the respective active region,
wherein at least some of the luminescent material particles are arranged between active regions of the plurality of active regions,
wherein a diameter of each luminescent material particle of a majority of the luminescent material particles is smaller than a distance between two adjacent active regions of the plurality of active regions,
wherein the different types of luminescent material particles are arranged in different layers; and
wherein luminescent material particles of a first type are disposed in a first layer that covers an outer surface of each active region of the plurality of active regions, and wherein the first layer has intermediate spaces between two adjacent active regions of the plurality of active regions, and wherein luminescent material particles of a second type different from the first type fill the intermediate spaces.

5. The optoelectronic semiconductor component according to claim 4, wherein a D90 diameter of each luminescent material particle of the majority of the luminescent material particles is smaller than an average minimum distance between adjacent active regions of the plurality of active regions.

6. The optoelectronic semiconductor component according to claim 4, wherein a D50 diameter of each luminescent material particle of the majority of the luminescent material particles is between at least 10% and at most 50% of an average minimum distance between adjacent active regions of the plurality of active regions.

7. The optoelectronic semiconductor component according to claim 4, wherein a current spreading layer covers at least a portion of each active region of the plurality of active regions at an outer surface of the respective active region, and wherein the current spreading layer connects each active of the plurality of active regions together in an electrically conductive manner.

8. The Optoelectronic semiconductor component according to claim 4, wherein some of the luminescent material particles directly adjoin at least one of the cover layer of the plurality of active regions or a current spreading layer.

9. The optoelectronic semiconductor component according to claim 8, wherein a distance between some of the luminescent material particles and at least one active layer of at least one active region of the plurality of active regions is at most 100 nm.

10. The optoelectronic semiconductor component according to claim 4, wherein each particle of the luminescent material particles is covered at least partially by radiation-scattering and/or radiation-absorbing particles.

11. The optoelectronic semiconductor component according to claim 10, wherein the luminescent material particles and the radiation-scattering and/or radiation-absorbing particles are electrophoretically applied.

12. The optoelectronic semiconductor component according to claim 10, wherein a passivation layer covers the luminescent material particles and the radiation-scattering and/or radiation-absorbing particles at least on their sides facing away from the plurality of active regions.

13. The optoelectronic semiconductor component according to claim 4, wherein the component is free of a matrix material for the luminescent material particles.

14. The optoelectronic semiconductor component according to the claim 4, wherein a distance between some of the luminescent material particles and at least one active layer of the plurality of active regions is at most 100 nm, and wherein the optoelectronic semiconductor component is free of a matrix material for the luminescent material particles.

15. An optoelectronic semiconductor component, the component comprising:
a plurality of active regions configured to generate a primary radiation; and
luminescent material particles of different types configured to convert the primary radiation into a secondary radiation of different wavelengths;
wherein each active region of the plurality of active regions are arranged spaced apart from each other active region of the plurality of active regions;
wherein each active region of the plurality of active regions has a main extension direction;
wherein each active region of the plurality of active regions has a core region comprising a first semiconductor material;
wherein each active region of the plurality of active regions comprises an active layer covering the core region at least in directions transverse to the main extension direction of the respective active region;

wherein each active region of the plurality of active regions comprises a cover layer comprising a second semiconductor material and covering the active layer at least in the directions transverse to the main extension direction of the respective active region;

wherein at least some of the luminescent material particles are arranged between active regions of the plurality of active regions;

wherein a diameter of each luminescent material particle of a majority of the luminescent material particles is smaller than a distance between two adjacent active regions of the plurality of active regions;

wherein the different types of luminescent material particles are arranged in different layers;

wherein luminescent material particles of a first type completely occupy each active region of the plurality of active regions and intermediate spaces between the plurality of active regions; and wherein luminescent material particles of a second type different from the first type are arranged as a layer on the luminescent material particles of the first type.

16. A method for producing an optoelectronic semiconductor component, the method comprising:

providing a plurality of active regions configured to generate a primary radiation;

providing a suspension comprising a solvent and luminescent material particles of different types, the luminescent material particles being configured to convert the primary radiation into a secondary radiation; and electrophoretically depositing at least some of the luminescent material particles between active regions of the plurality of active regions;

wherein a diameter of each luminescent material particle of a majority of the luminescent material particles, which are electrophoretically deposited, is smaller than a distance between two adjacent active regions of the plurality of active regions, wherein different types of luminescent material particles are arranged in different layers, wherein luminescent material particles of a first type completely occupy each active region of the plurality of active regions and intermediate spaces between the plurality of active regions, and wherein luminescent material particles of a second type different from the first type are arranged as a layer on the luminescent material particles of the first type.

* * * * *